US007064392B1

(12) United States Patent
Morishita

(10) Patent No.: US 7,064,392 B1
(45) Date of Patent: Jun. 20, 2006

(54) SEMICONDUCTOR DEVICE

(75) Inventor: Yasuyuki Morishita, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/621,614

(22) Filed: Jul. 21, 2000

(30) Foreign Application Priority Data

Jul. 23, 1999 (JP) ................................ 11-209407

(51) Int. Cl.
*H01L 23/62* (2006.01)

(52) U.S. Cl. ....................... 257/360; 257/355; 257/357

(58) Field of Classification Search ......... 257/355–363
See application file for complete search history.

(56) References Cited

U.S. PATENT DOCUMENTS 4,887,142 A * 12/1989 Bertotti et al. .............. 257/338
5,041,895 A * 8/1991 Contiero et al. ............ 257/370
5,162,888 A * 11/1992 Co et al. .................... 257/408
5,281,841 A * 1/1994 Van Roozendaal et al. . 257/360
5,502,317 A * 3/1996 Duvvury ..................... 257/107
5,572,394 A 11/1996 Ker et al. ..................... 361/56
5,576,557 A * 11/1996 Ker et al. ................... 257/173
5,581,103 A 12/1996 Mizukami ................... 257/355
5,701,024 A * 12/1997 Watt ........................... 257/360
5,710,689 A * 1/1998 Becerra et al. ............... 361/57
5,814,865 A * 9/1998 Duvvury et al. ............ 257/360
5,898,206 A 4/1999 Yamamoto .................. 257/360
5,969,391 A 10/1999 Tajima ....................... 257/373
6,008,684 A * 12/1999 Ker et al. ................... 327/428
6,011,681 A * 1/2000 Ker et al. ................... 361/111
6,015,992 A 1/2000 Chatterjee et al. .......... 257/350
6,191,454 B1 * 2/2001 Hirata et al. ................ 257/360
6,242,787 B1 * 6/2001 Nakayama et al. ......... 257/493

FOREIGN PATENT DOCUMENTS

| | | |
|---|---|---|
| JP | 06-053420 | 2/1994 |
| JP | 07-029987 | 1/1995 |
| JP | 08-288403 | 11/1996 |
| JP | 9-321150 | 12/1997 |
| JP | 10-173070 | * 6/1998 |
| JP | 10-189756 | 7/1998 |
| JP | 10-294430 | 11/1998 |

* cited by examiner

*Primary Examiner*—Ori Nadav
(74) *Attorney, Agent, or Firm*—Foley & Lardner LLP

(57) ABSTRACT

In an N-channel type field effect transistor constituting an input/output protection circuit, an N-type well 1*a* with a lower dopant concentration than the source region 3*c* is formed under the source region 3*c*.

15 Claims, 9 Drawing Sheets

7
8
9
5
11
4c
3a
4a
10
3c
6
12
3b
4b
13
1b
2
20
1a
P channel MOSFET
N channel MOSFET

SEMICONDUCTOR DEVICE

BACKGROUND OF THE INVENTION

1. Field of the Invention

The present invention relates to a semiconductor device having an input protection circuit section or an output protection circuit section between an input/output terminal and an internal circuit to prevent the electrostatic discharge (ESD).

2. Description of the Related Art

In a semiconductor integrated circuit device, an input protection circuit section or an output protection circuit section {referred to as an input/output protection circuit section, hereinafter) is set between an input terminal or an output terminal (referred to as an input/output terminal, hereinafter} and an internal circuit in order to protect circuit elements inside from failure which may be brought about by an ESD or the like applied to the input/output terminal.

An input/output protection circuit section itself is generally composed of CMOSs (Complementary Metal-Oxide-Semiconductor) in each of which an N-channel MOSFET (Field Effect Transistor) and a P-channel MOSFET are connected in series between the supply voltage VDD and the ground voltage GND. FIG. 14 is a diagram of an input protection circuit composed of CMOSs and FIG. 15, a diagram of an output protection circuit composed of CMOSs. Now, referring to the drawings, an example of a conventional input protection circuit section composed as shown in FIG. 14 is described below.

FIG. 6 is a plan view showing a conventional input protection circuit section composed of CMOSs and FIG. 7, a cross-sectional view showing the portion A–A' of FIG. 6. As shown in FIG. 7, on the surface of a P-type silicon substrate 20, an N-type well 1*b* and a P-type well 2 is formed. In the region where the P-type well 2 is formed, an N-channel MOSFET comprising a gate electrode 6, a source region 3*c* and a drain region 3*b* is formed. In the periphery of the N-channel MOSFET formation area, a P-type dopant diffusion region 4*a* is set (FIG. 6), and thereby the electric potential of the P-type well 2 is defined. The P-type dopant diffusion region 4*a* and the source region 3*c*, set separated by an element isolation film 10, are both connected with a ground terminal 9 (GND). The drain region 3*b* is connected with an input terminal 7.

Meanwhile, in the region where the N-type well 1*b* is formed, a P-channel MOSFET comprising a gate electrode 5, a source region 4*c* and a drain region 4*b* is formed. In the periphery of the P-channel MOSFET formation area, an N-type dopant diffusion region 3*a* is set (FIG. 6), and thereby the electric potential of the N-type well 1*b* is defined. The N-type dopant diffusion region 3*a* and the source region 4*c*, set separated by an element isolation film 10, are both connected with a supply terminal 8 ($V_{DD}$). The drain region 4*b* is connected with an input terminal 7.

Further, for the purpose of lowering electrical resistance, silicide layers 13 are formed over the surfaces of the source-drain regions and such, in every transistor.

Next, operations that take place on application of an external surge to the input terminal 7 are described. Firstly, operations that the N-channel MOSFET makes when an external surge is applied to the input terminal 7 with a negative voltage with respect to the ground terminal 9 are described. A forward voltage is, in this instance, applied to the PN-junction between the drain region 3*b* (N-type) and the P-type well 2 and the PN diode is turned on in the forward direction so that the negatively polarized surge flows down from the input terminal 7, through the drain region 3*b* and the P-type well 2, to the ground terminal 9. Next, operations produced when an external surge is applied to the input terminal 7 with a positive voltage with respect to the ground terminal 9 are described. In this case, a positive voltage with respect to the P-type well of the N-channel transistor is applied to the drain. When this voltage exceeds a certain value, an avalanche breakdown takes place in the vicinity of the drain region 3*b*. After the breakdown, a current flows from the drain region 3*b* to the P-type well 2 and this current leads the P-type well 2 to have a positive electric potential, which results in turning-on of an NPN parasitic bipolar transistor in which the drain region 3*b*, the P-type well 2 and the source region 3*c* act as a collector, a base and an emitter, respectively. The surge, then, flows from the internal terminal 7, through the drain region 3*b*, the P-type well 2 and the source region 3*c*, and consequently to the ground terminal 9. The operations described above are further described with reference to FIG. 9. In FIG. 9, when the drain voltage reaches the breakdown voltage $V_B$, the breakdown takes place and, after that, the voltage rises, up to the trigger voltage $V_{t1}$. Once the voltage reaches $V_{t1}$, the NPN parasitic bipolar transistor is turned on, and the voltage drops to the snap-back holding voltage $V_S$. When the current and the voltage rise again and reach the value of the current $I_{t2}$ and the value of the voltage $V_{t2}$, respectively, the transistor is driven to a failure.

While only operations of the N-channel MOSFET are described so far, the P-channel MOSFET operates in a similar fashion. In short, when an external surge is applied to the internal terminal 7 with a positive or a negative voltage with respect to the supply terminal 8, either the PN junction in the forward direction is turned on, or alternatively, a lateral parasitic bipolar transistor is turned on. In either way, the surge flows down to the supply terminal 8 and thereby the internal circuit is protected.

However, the protection circuit section described above has the following problem, originating from the fact that $V_{t2}$ (the transistor failure voltage) is lower than $V_{t1}$ (the trigger voltage), as seen in FIG. 9.

The protection circuit section is normally composed of a plurality of transistors, and each transistor has a slightly different own trigger voltage of the snap-back. As a result, when the snap-back operation starts, it is made by not all but only some of the transistors. However, the voltage of the input/output terminal, thereat, falls back to the snap-back holding voltage $V_S$ of these transistors, and, then, recovers only up to $V_{t2}$ of these transistors. With respect to the rest of the transistors, therefore, the snap-back operation cannot be induced, since the drain voltage does not exceed their own $V_{t1}$. In consequence, the surge always flows down only to the transistors making the snap-back operation and leads them to failures, which lowers the protective capability of the protection circuit section. In recent years, with the object of reducing the parasitic resistance and the like, metal silicide films are often formed over the surfaces of the source-drain regions of the transistors and such. In such a case, the surge current is drawn to the vicinity of metal silicide layers of low resistivity so that the above problem becomes more pronounced.

Although the above description is made, with N-channel transistors considered, the similar can be applied to the case of P-channel transistors.

To overcome the above problem, a high-resistance region is often set by the side of the drain region of the transistor. FIG. 10 and FIG. 11 show the protection circuit section disclosed in Japanese Application Laid-open No. 173070/

1998. In this protection circuit section, an N-type well 1*c* is formed by the side of a drain region 3*b* of an N-channel MOSFET, and a control electrode 6*a* is set in order to define the electric potential of the N-type well 1*c* (FIG. 11). With the N-type well resistance 14, the resistance between the input terminal 7 and the ground terminal 9 increases and the relationship between the drain voltage $V_{ds}$ and the drain current $I_{ds}$ becomes the one as shown in FIG. 12. In the drawing, the dotted line represents the profile of the conventional technique and the solid line, the profile of the protection circuit section of FIG. 11. In the profile of the solid line, the value of $dI_{ds}/dV_{ds}$ between $V_S$ and $V_{t2}$ is made smaller by the presence of the N-type well resistance 14, and, consequently, $V_{t2}$ increases to establish the relationship $V_{t1}<V_{t2}$. Under this condition, even if only some of the transistors are induced to make the snap-back operation first, the rest of the transistors are also induced to make the snap-back operation in the similar fashion, as the drain voltage, after the snap-back, increases from $V_S$ to $V_{t2}$, and, thus, a plurality of transistors all function alike. Therefore, more than sufficient surge-proof (ESD (Electrostatic Discharge)-proof) can be secured, without lowering protective capability thereof. In this way, the use of a method in which a high-resistance region is set can make a plurality of transistors operate all alike and heighten the reliability of the protection circuit section. Accordingly, the above method is widely utilized for the protection circuit sections. Yet, this method wherein a high-resistance region is formed still has problems in the following points. Firstly, an addition of a high-resistance region lowers the driving capability of the protection circuit section and worsens the quality of high-speed operation thereof. Secondly, as the drain current of the transistor becomes smaller due to the presence of the high-resistance region, the transistor size required to secure a prescribed driving current in the output circuit or the like becomes larger. Thirdly, in order to dispose a resistance element between a gate and a contact in the drain region of the protection circuit section, the spacing between the gate and the drain must be set wider, which hinders the LSI (Large Scale-Integrated circuit) miniaturization.

Meanwhile, for the arrangement of the protection circuit section in the LSI, a form in which a protection circuit section composed of complementary field effect transistors is set between the supply voltage VDD and the ground voltage GND is generally utilized. This arrangement can make a surge flow down to the GND or the VDD efficiently and, therefore, can attain a good ESD-proof and maintain the quality for the protection circuit response.

When the protection circuit section composed of complementary field effect transistors is employed, prevention of latch-up becomes another important technical problem. As a prevention measure of latch-up, it is well known that setting a dopant high-concentration region beneath wells in the transistor formation area is effective (Japanese Patent Application Laid-open No. 321150/1997). FIG. 13 shows an example of the CMOS with such a structure. Nevertheless, when such a structure is employed for the protection circuit section, although the latch-up-proof certainly, improves through a reduction of the shunt resistance, a problem of a decrease in the ESD-proof arises. The explanation lies in the fact that, with reducing the shunt resistance, the current amplification factor of the parasitic bipolar transistor decreases and this makes the parasitic bipolar operation difficult to induce. In effect, this structure has an adverse effect on the protection circuit section that makes use of parasitic bipolar operations. Accordingly, a technique that can improve the latch-up-proof while maintaining the ESD-proof of the protection circuit section has been very much waited for.

SUMMARY OF THE INVENTION

An object of the present invention is to provide a semiconductor device that has an excellent driving capability and a good quality for high-speed operation, with ESD-proof as well as latch-up-proof amply provided, while the element size of an input/output protection circuit section thereof successfully reduced.

In light of the above problems, the present invention provides a semiconductor device having an input/output protection circuit section on a semiconductor substrate;

wherein:

said input/output protection circuit section comprises a plurality of field effect transistors connected in parallel, each of which has a first and second diffusion layers of first conductive type and a gate electrode that is set in the region sandwiched between these layers; and a dopant diffusion region of second conductive type is set at a distance from the region where said plurality of field effect transistors are formed; and while said dopant diffusion region is connected with a reference potential, the second diffusion layer is connected with an input/output terminal section; and under the first diffusion layer, there is formed a first conductive type well with a lower dopant concentration than the first diffusion layer.

Because the input/output protection circuit section contained in a semiconductor device of the present invention has, under the first diffusion layer, a first conductive type well with a lower dopant concentration than the first diffusion layer, the base potential of a lateral parasitic bipolar transistor that is composed of a first and second diffusion layers and a region sandwiched between these layers can be readily raised, and the snap-back, easily induced thereto. This enables the present protection circuit to take a lower value of the trigger voltage $V_{t1}$ than the conventional ones. In consequence, the amount of the injection current necessary to make the parasitic bipolar transistor operate can be reduced, which leads to a higher speed of response. Furthermore, as the condition $V_{t1}<V_{t2}$ can be established, a plurality of transistors composing the protection circuit section all operate alike so that it can be prevented that the surge flows down only to some specific transistors. Therefore, improvements on the ESD-proof as well as on the reliability of the protection circuit section can be attained.

Further, the semiconductor device described above has the structure in which the second diffusion layer is connected with the input/output terminal section, that is, the field effect transistor is directly connected with the input/output terminal section. In conventional techniques, an input/output terminal section is often connected through a high-resistance region to a transistor section, as shown in FIG. 11. In contrast with this, the present invention has a structure in which an input/output terminal section and a transistor section are directly connected with each other. This allows the first conductive type well to demonstrate its function fully and facilitates the parasitic bipolar operations. Moreover, as the surge is directly applied to the drain without passing through a resistance, the response of the protection circuit becomes faster. Because a resistance is not passed through, with a such a connection, the drain current of the transistor is not lowered, and a sufficient driving current can be readily secured even in the output circuit or the like. Further, since no additional resistance element is disposed between a gate and a contact in the drain region of the protection circuit section, the spacing between gates can be narrowed and the element size of the input/output protection circuit section can be reduced, which is an advantage to make miniaturization of the LSI. Regarding the second conductive type dopant diffusion region, one or more regions may be formed for the whole of a plurality of field effect transistors. Further, in respect of the geometrical arrangement, the second conductive type dopant diffusion region may be formed without any specific limitation, as long as it is formed at a distance from the region where a plurality of field effect transistors are formed. For instance, it can be formed to encircle a plurality of field effect transistors all together like the P-type dopant diffusion region 4*a* of FIG. 1.

In the semiconductor device described above, it is preferable to have a structure, in which the gate electrode and the dopant diffusion region of second conductive type are placed over the second conductive type well that is formed on the surface of the semiconductor substrate; and the bottom of the first conductive type well is formed at the same depth as the bottom of the second conductive type well or at a level deeper than the bottom of the second conductive type well. In other words, it is preferable that the gate electrode of the field effect transistor and the dopant diffusion region of second conductive type are formed over the second conductive type well, and the first conductive type well has a depth not less than the depth of the second conductive type well. With such a structure, after the breakdown of the drain section, a current flows through the semiconductor substrate that has a higher resistance than the second conductive well, which facilitates the potential of the base region of the afore-mentioned lateral parasitic bipolar transistor to rise and, therefore, makes the trigger voltage $V_{t1}$ lowered more effectively. This further improves the quality of the response of the protection circuit section as well as the ESD-proof.

Further, the present invention provides a semiconductor device having, on a semiconductor substrate, in input/output protection circuit section that contains a complementary field effect transistor; wherein:

said complementary field effect transistor is composed of a first field effect transistor having a first and second diffusion layers of first conductive type and a gate electrode that is set in the region sandwiched between these layers and a second field effect transistor having a third and fourth diffusion layers of second conductive type and a gate electrode that is set in the region sandwiched between these layers; and a first dopant diffusion region of second conductive type is set at a distance from the region where said first field effect transistor is formed and a second dopant diffusion region of first conductive type is set at a distance from the region where said second field effect transistor is formed; and the first dopant diffusion region is connected with a first reference potential; the second dopant diffusion region, with a second reference potential; and the second diffusion layer and the fourth diffusion layer are each connected with an input/output terminal section; and under the first diffusion layer, there is formed a first conductive type well with a lower dopant concentration than the first diffusion layer.

Because the input/output protection circuit section of this semiconductor device comprises a complementary field effect transistor, a surge can flow down through a plurality of lines efficiently so that the quality of high-speed operation of the protection circuit as well as the ESD-proof can be further improved. For the purpose of improving the reliability of the protection circuit, it is preferable that a plurality of N-channel type field effect transistors are provided to compose a complementary field effect transistor.

In this semiconductor device, it is preferable to have a structure, in which the gate electrode of the first field effect transistor and the first dopant diffusion region are placed over the second conductive type well that is formed on the surface of the semiconductor substrate; and the bottom of the first conductive type well is formed at the same depth as the bottom of the second conductive type well or at a level deeper than the bottom of the second conductive type well. In other words, it is preferable that the gate electrode of the first field effect transistor and the first dopant diffusion region are formed over the second conductive type well, and the first conductive type well has a depth not less than the depth of the second conductive type well. With such a structure, after the breakdown of the drain section, a current flows through the semiconductor substrate that has a higher resistance than the second conductive well, which facilitates the potential of the base region of the afore-mentioned lateral parasitic bipolar transistor to rise and, therefore, makes the trigger voltage $V_{t1}$ lowered more effectively. This further improves the quality of the response of the protection circuit section as well as the ESD-proof.

Further, if this semiconductor device has, in addition, a structure in which, beneath the second conductive type well, there is set a dopant high-concentration region containing second conductive type dopants with a higher dopant concentration than the second conductive type well; and the bottom of the first conductive type well is formed at the same depth as the bottom of the dopant high-concentration region or at a level deeper than the bottom of the dopant high-concentration region, a protection circuit section having a good ESD-proof, together with a good latch-up-proof, can be obtained. As described above, it is well known that setting a dopant high-concentration region at the bottom of the wells can reduce the shunt resistance and improve the latch-up-proof. However, with reducing the shunt resistance, the current amplification factor of the parasitic bipolar transistor decreases, which makes the parasitic bipolar operations difficult to induce and gives rise to a problem of lowering the ESD-proof. The present invention, hereat, overcomes the above problem by setting a first conductive type well that reaches a depth equal to or deeper than that of the bottom of the dopant high-concentration region. FIG. 3 shows an example with the structure described above, and an N-type well 1*a* reaching the same depth as the dopant high-concentration region 16 is set therein. With such an N-type well 1*a* being set, after the breakdown of the drain region 3*b*, a current starts flowing down through the semiconductor substrate 20 that has a high electric resistance. This facilitates the electric potential of the base region 2 of the lateral parasitic bipolar transistor to increase and, at the same time, can reduce the trigger voltage $V_{t1}$ so that the ESD-proof may be improved. Meanwhile, in the internal circuit region (not shown in the drawing), because the shunt resistance is made smaller by the dopant high-concentration regions 15 and 16, the proof can be a good deal improved against latch-up that may occur between the input/output protection circuit section and the internal circuit region.

In the present invention, it is preferable that the field effect transistor to which a first conductive well is additionally set is an N-channel type field effect transistor. This results from the fact that an NPN-type parasitic bipolar transistor has a higher current amplification factor and besides, high-speed operations thereof have a better quality than those of a PNP-type one.

DETAILED DESCRIPTION OF THE PREFFERED EMBODYMENTS

Figure 1:
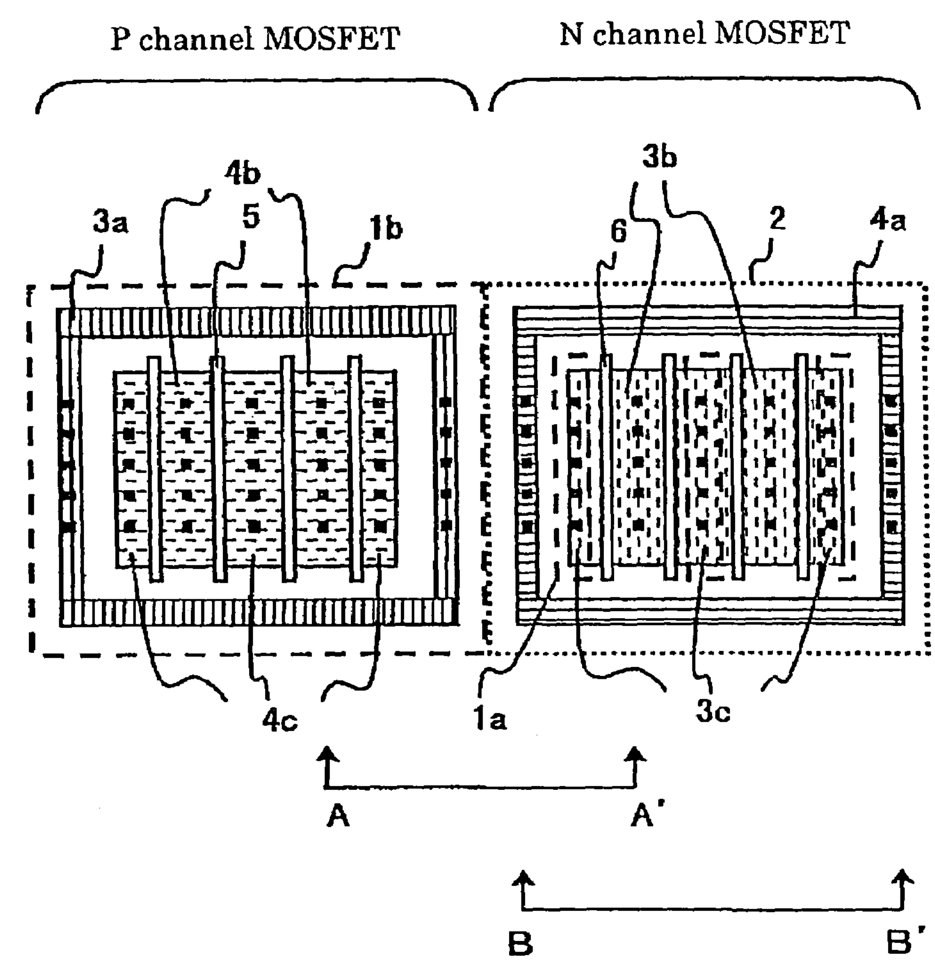
FIG. 1 is a schematic top plan view showing a protection circuit section of a semiconductor device in accordance with the present invention.
Figure 2:
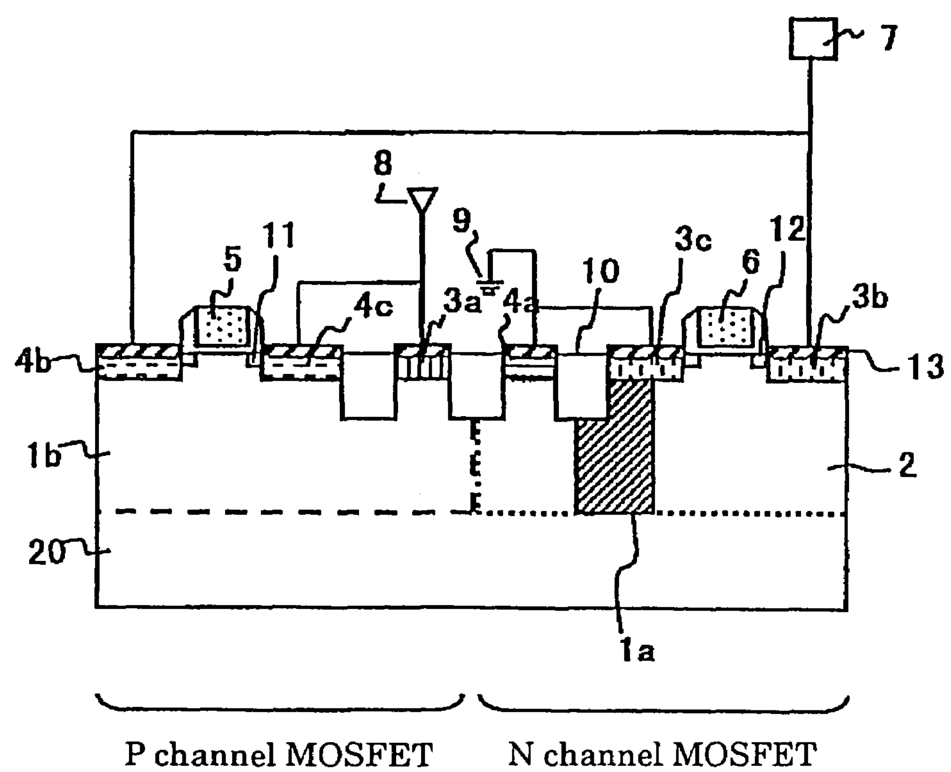
FIG. 2 is a schematic cross-sectional view showing the portion A–A' of FIG. 1.

Referring to FIG. 1, FIG. 2 and such, the preferred modes of the present invention are described. The present mode represents one example of the semiconductor device having an input/output protection circuit section that contains a CMOS. FIG. 1 is a plan view showing an input protection circuit section in accordance with the present invention, and FIG. 2, a cross-sectional view showing the portion A–A' of FIG. 2. As shown in FIG. 2, a CMOS of the present embodiment has a twin-well structure in which an N-type well 1*b* and a P-type well 2 are formed, adjoining each other on the surface of a P-type silicon substrate 20. The dopant concentration of the N-type well 1*b* and the P-type well 2 are set, for example, to be $1.0\times10^{17}$ to $1.0\times10^{18}$ $cm^{-3}$ or so. Further, while the present embodiment employs the twin-cell structure, the semiconductor device of the present invention is not limited to use such a structure and is able to utilize any of various well structures including a single-well and triple-well structures.

As shown in FIG. 2, an N-channel MOSFET is formed in the region where the P-type well 2 is formed. The N-channel MOSFET comprises a gate electrode 6, a source region 3*c*, a drain region 3*b* and an extension region 12. The extension region 12 as used herein indicates the region where the dopant concentration is lower than that of the source-drain regions. For instance, while the dopant concentrations of the source region 3*c* and the drain region 3*b* are $1.0\times10^{20}$ $cm^{-3}$ or so, the dopant concentration of the extension region is $1.0\times10^{19}$ $cm^{-3}$ or so. Further, between the gate electrode 6 and the substrate, there is set a gate insulating film. As the gate insulating film, in addition to a silicon oxide film, a silicon nitride film, a silicon oxynitride film or a film made of a high dielectric material such as tantalum oxide ($Ta_2O_5$) may be utilized.

In the periphery of the N-channel MOSFET formation area, a P-type dopant diffusion region 4*a* is set (FIG. 1), and thereby the electric potential of the P-type well 2 is defined. The P-type dopant diffusion region 4*a* and the source region 3*c*, set separated by an element isolation film 10, are both connected with a ground terminal 9 (GND). The drain region 3*b* is connected with an input terminal 7. Under the source region 3*c* and the element isolation film 10, an N-type well 1*a* is formed. The dopant concentration of the N-type well 1*a* is set to be lower than the dopant concentration of the overlying source region 3*c*. As the dopant concentration of the N-type well 1*a*, $1.0\times10^{17}$ to $1.0\times10^{18}$ $cm^{-3}$ is appropriate.

Meanwhile, in the region where the N-type well 1*b* is formed, a P-channel MOSFET comprising a gate electrode 5, a source region 4*c*, a drain region 4*b* and an extension region 11 is formed. Regarding the dopant concentrations of respective regions, description of the gate insulating film and such, the same as the N-channel MOSFET can be employed to form the analogous structure. If the dopant concentration of the N-type well 1*b* and the N-type well 1*a* are set to be the same, these wells can be formed in one and the same step, which is advantageous to simplify the steps of a manufacturing method. In the periphery of the P-channel MOSFET formation area, an N-type dopant diffusion region 3*a* is set (FIG. 1), and thereby the electric potential of the N-type well 1*b* is defined. The N-type dopant diffusion region 3*a* and the source region 4*c*, set separated by an element isolation film 10, are both connected with a supply terminal 8 ($V_{DD}$). The drain region 4*b* is connected with an input terminal 7.

Further, for the purpose of lowering the parasitic resistance and such, silicide layers 13 are formed over the surfaces of the source-drain regions and such, in every transistor. The silicide layers 13 are made of a material such as titanium silicide, cobalt silicide and the like.

Next, operations that the N-channel MOSFET makes when an external surge is applied through the input terminal 7 to the protection circuit section with the above structure are described.

Figure 5:
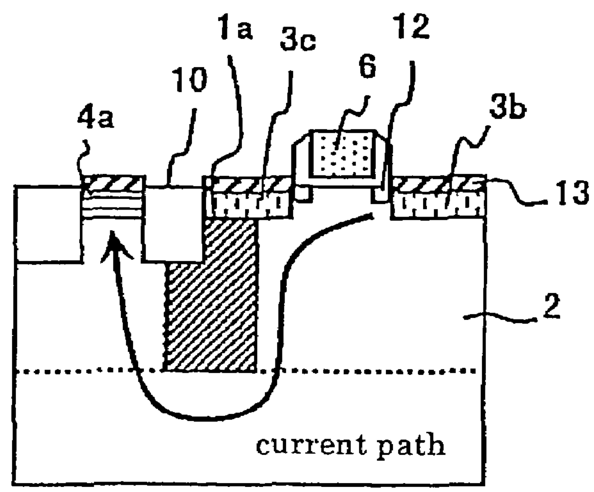
FIG. 5 is a view in explaining the current path of a surge current in an input protection circuit section of a semiconductor device in accordance with the present invention.
Figure 6:
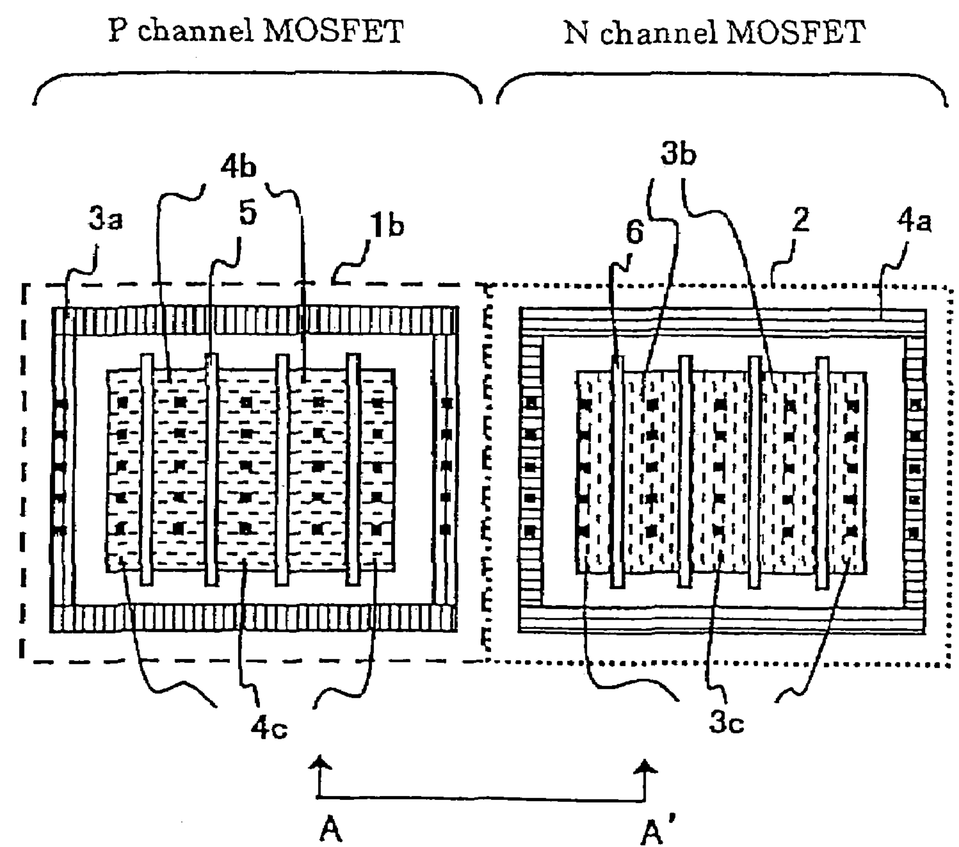
FIG. 6 is a schematic top plan view showing a protection circuit section of a conventional semiconductor device.
Figure 7:
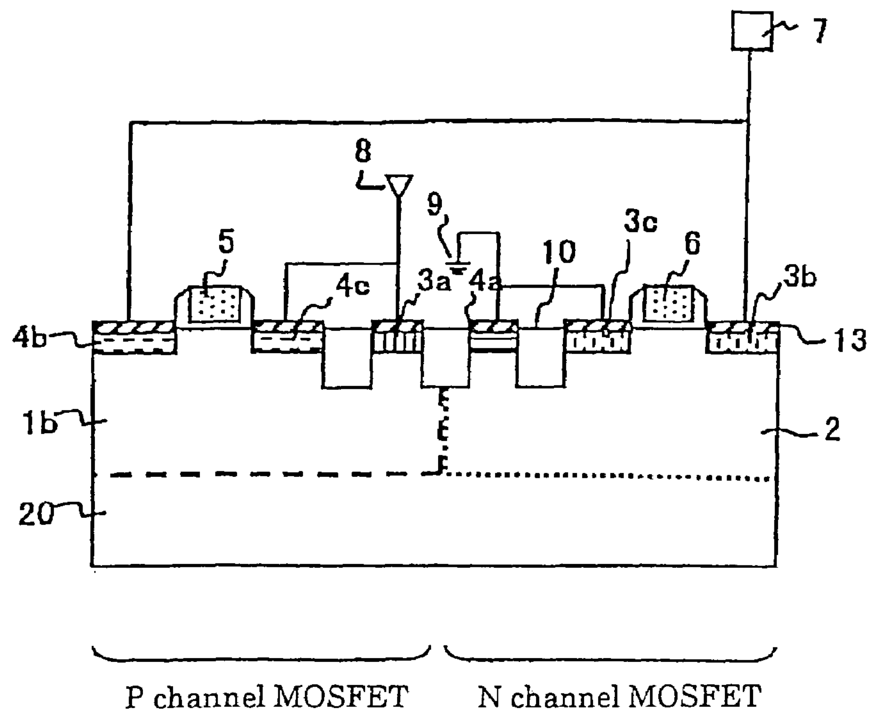
FIG. 7 is a schematic cross-sectional view showing the portion A–A' of FIG. 6.

Firstly, when a negatively polarized surge with respect to the ground terminal 9 is applied to the input terminal 7, a forward voltage is applied to the PN-junction between the drain region 3*b* (N-type) and the P-type well 2 and the PN diode is turned on in the forward direction so that the negatively polarized surge flows down from the input terminal 7, through the drain region 3*b* and the P-type well 2, to the ground terminal 9. Next, when a positively polarized surge with respect to the ground terminal 9 is applied to the input terminal 7, a positive voltage with respect to the P-type well of the N-channel transistor is applied to the drain. When this voltage exceeds a certain value, an avalanche breakdown takes place in the vicinity of the drain region 3*b*. After the breakdown, a hole current flows from the drain region 3*b* to the P-type well 2 and this current leads the P-type well 2 to have a positive electric potential, which results in turning-on of an NPN parasitic bipolar transistor in which the drain region 3*b*, the P-type well 2 and the source region 3*c* act as a collector, a base and an emitter, respectively. The surge, then, flows from the internal terminal 7, through the drain region 3*b*, the P-type well 2 and the source region 3*c*, and consequently to the ground terminal 9. Since the N-type well 1*a* is formed under the source region 3*c* in the present embodiment, the electric potential of the base region of the NPN parasitic bipolar transistor (the P-type well 2 under the gate electrode 6 in FIG. 2) becomes easily raised after the breakdown. This can be explained in the following way. Namely, because a hole current generated due to the breakdown starts flowing along the current path through the silicon substrate 20 of a high resistivity, as indicated by the arrow in FIG. 5, the electric potential of the base region of the parasitic bipolar transistor increases as much as the voltage drop brought about through the silicon substrate 20 of a high resistivity. As the potential of the base region of the parasitic bipolar transistor readily increases in this manner, the snap-back can be easily induced thereto.

Figure 4:
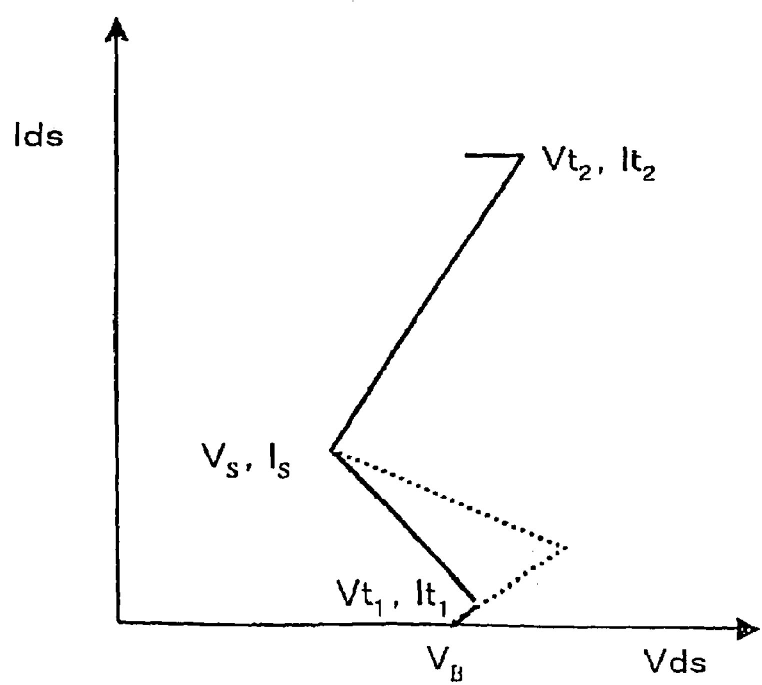
FIG. 4 is a diagram showing the I–V characteristic of a transistor in a protection circuit section of a semiconductor device in accordance with the present invention.

The operations described above are further described with reference to FIG. 4. In FIG. 4, when the drain voltage reaches the breakdown voltage VB, the breakdown takes place and, after that, the voltage rises up to the trigger voltage $V_{t1}$. The value of $V_{t1}$ is smaller than that of the conventional one, as described above. After the NPN parasitic bipolar transistor is turned on, the voltage drops to $V_S$. Thereafter the current and the voltage rise again and reach the transistor failure current $I_{t2}$ and the transistor failure voltage $V_{t2}$, respectively. As $V_{t1}$ is lowered, the condition $V_{t1}<V_{t2}$ holds. Under this condition, even if only some of the transistors are induced to make the snap-back operation first, the rest of the transistors can be also induced to make the snap-back operation in the similar fashion, as the drain voltage, after the snap-back, increases from $V_S$ to $V_{t2}$. In this manner, in the protection circuit section of the present embodiment, a plurality of transistors composing the protection circuit section all function alike. Therefore, more than sufficient ESD-proof can be secured, without lowering protective capability thereof.

In the present embodiment, the ESD-proof is increased without setting a high resistance region so that high-speed operations become possible, and the response of the protection circuit become faster than obtained so far. In addition, the drain current of the transistor is not lowered, and a sufficient driving current can be readily secured even in the output circuit or the like. Further, since no additional resistance element is disposed between a gate and a contact in the drain region of the protection circuit section, the spacing between gates can be narrowed and the element size of the input/output protection circuit section can be reduced, which is an advantage to make miniaturization of the LSI.

As described above, the present invention establishes the relationship $$V_{t1}\text{ (trigger voltage)}<V_{t2}\text{ (transistor failure voltage)},$$

by setting an N-type well 1*a*, instead of employing the conventional method wherein a high-resistance region is set. In other words, in place of increasing $V_{t2}$ by setting a high-resistance region, $V_{t1}$ is decreased by setting an N-type well 1*a* and thereby the above condition is established. While the above relationship can be obtained solely by means of setting an N-type well 1*a*, it is preferable to make the difference between $V_{t2}$ and $V_{t1}$ as large as possible so as to enhance the reliability of the protection circuit section. Especially when the structure in which silicide layers are set on the surfaces of the source-drain regions and such of the transistor is employed, failures of the transistors become more liable to happen owing to the surge gathering, and, therefore, increasing the difference between $V_{t2}$ and $V_{t1}$ gains in importance further. In this respect, it is more effective if an additional arrangement described below is made. That is, (i) the gate length or the length of the gate electrode 6 as seen in FIG. 2 is set to be not greater than 0.2 μm, or alternatively, (ii) a first and second diffusion layers (the source region 3*c* and the drain region 3*b* in the present embodiment) are each made to have an extension structure. Such an arrangement together with setting an N-type well 1*a* produces the multiplication effect, and the parasitic bipolar transistor composed of the source region 3*c*, the P-type well 2 under the gate electrode 6 and the drain region 3*b* becomes more easily turned on so that $V_{t1}$ can be lowered with effect. The extension structure as used herein indicates a structure wherein dopant diffusion regions with a lower dopant concentration than the source-drain regions are set at end sections of the source-drain regions on the side of the channel layer, and this structure may be formed by oblique rotational ion implantation. As the dopant concentration of the extension region, $1.0\times10^{19}$ $cm^{-3}$ to $1.0\times10^{20}$ $cm^{-3}$ is appropriate.

Further, although the element isolation film 10 is set between the source region 3*c* and the P-type dopant diffusion region 4*a* in the present embodiment, the source region 3*c* and the P-type dopant diffusion region 4*a* can be placed next to each other without setting this element isolation film therebetween. Such an arrangement can further reduce the size of the protection circuit section. In the conventional techniques, the distance between the P-type dopant diffusion region 4*a* and the channel layer of the N-channel MOSFET is set considerably large, and besides, in order to increase the resistance therebetween, the element isolation film 10 described above is set therein. Without this arrangement, the electric potential of the base region (the P-type well 2 under the gate electrode 6) of the parasitic bipolar transistor cannot be raised sufficiently high and it is difficult to bring about the snap-back. In contrast with this, in the present invention, with the N-type well 1*a* being set, the snap-back operation of the parasitic bipolar transistor can be readily induced, even if the distance between the P-type dopant diffusion region 4*a* and the N-channel MOSFET is short. Accordingly, in the case that the structure of the present invention is employed, it is possible to dispose the source region 3*c* and the P-type dopant diffusion region 4*a* next to each other, without setting the element isolation film 10 at all.

While an example in which the N-type well is formed in the N-channel MOSFET is shown in the present embodiment, a P-type well can be set under the source region 4*c* of the P-channel MOSFET. In this instance, however, it is preferable that either the P-type well is formed not so deep as the N-type well 1*b* or an N-type substrate is employed therefor.

Further, in the present embodiment, there is shown an example with the protection circuit section that contains a CMOS structure section, but a protection circuit section composed of solely a plurality of MOSFETs can be employed. Further, although the present embodiment is described, taking an input circuit protection section as an example, it is to be understood that the present invention may be also applied to output circuit protection section.

EXAMPLES

Example 1

Referring to the drawings, the present example is described. FIG. 1 is a plan view showing an input protection circuit section of the present example and FIG. 2, a cross-sectional view showing the portion A–A' of FIG. 1. As shown in FIG. 2, on the surface of a P-type silicon substrate 20, an N-type well 1*b* (with a phosphorus concentration of $10^{17}/cm^3$ or so) and a P-type well 2 (with a boron concentration of $10^{17}$ $cm^3$ or so) is formed. In the region where the P-type well 2 is formed, an N-channel MOSFET comprising a gate electrode 6, a source region 3*c*, a drain region 3*b* and an extension region 11 is formed. In the periphery of the N-channel MOSFET formation area, a P-type dopant diffusion region 4*a* is set (FIG. 1), and thereby the electric potential of the P-type well 2 is defined. The P-type dopant diffusion region 4*a* and the source region 3*c*, set separated by an element isolation film 10, are both connected with a ground terminal 9 (GND). The drain region 3*b* is connected with an input terminal 7. Under the source region 3*c* and the element isolation film 10, an N-type well 1*a* (with a phosphorus concentration of $10^{17}/cm^3$ or so) is formed. In the present example, the N-type well 1*a*, the N-type well 1*b* and the P-type well 2 all have a depth of 1 μm or so.

Further, the extension region of the N-channel MOSFET is formed to have an arsenic concentration of $1\times10^{19}$ $cm^{-3}$.

Meanwhile, in the region where the N-type well 1*b* is formed, a P-channel MOSFET comprising a gate electrode 5, a source region 4*c*, a drain region 4*b* and an extension region 11 is formed. The N-type well 1*b* has a phosphorus concentration of $1\times10^{17}/cm^3$ or so, as the N-type well 1*a*.

In the periphery of the P-channel MOSFET formation area, an N-type dopant diffusion region 3*a* is set (FIG. 1), and thereby the electric potential of the N-type well 1*b* is defined. The N-type dopant diffusion region 3*a* and the source region 4*c*, set separated by an element isolation film 10, are both connected with a supply terminal 8 (VDD). The drain region 4*b* is connected with an input terminal 7.

The gate electrodes 5 and 6 are formed over a silicon oxide film on the substrate. The width of each gate electrode (gate length) is set to be 0.2 g m.

Further, for the purpose of lowering the parasitic resistance and the like, silicide layers 13 made of cobalt silicide are formed over the surfaces of the source-drain regions and such, in every transistor. Formation of these silicide layers 13 is carried out by forming, first, a cobalt film using the sputtering method and then applying a heat treatment thereto.

Next, operations of the protection circuit section ith the above structure are described. When an external surge is applied to the input terminal 7, the surge flows down along either a path through the N-channel MOSFET and the ground terminal 9 or a path through the P-channel MOSFET and the supply terminal 8 so that the internal circuit may be protected. Since the N-type well 1*a* is formed under the source region 3*c* in the present example, the electric potential of the base region of the NPN parasitic bipolar transistor (the P-type well 2 under the gate electrode 6) becomes easily raised after the breakdown. Consequently, with the trigger voltage of FIG. 4 being lowered, the relationship $V_{t1}<V_{t2}$ is established. Under this condition, even if only some of the transistors are induced to make the snap-back operation first, the rest of the transistors are also induced to make the snap-back operation in the similar fashion, as the drain voltage, after the snap-back, increases from $V_S$ to $V_{t2}$, and, thus, a plurality of transistors all function alike, and, as a result, the ESD-proof is improved. In a semiconductor device of the present example, the trigger voltage $V_{t1}$ and the transistor failure voltage $V_{t2}$ are approximately 6V and 9V, respectively.

Figure 11:
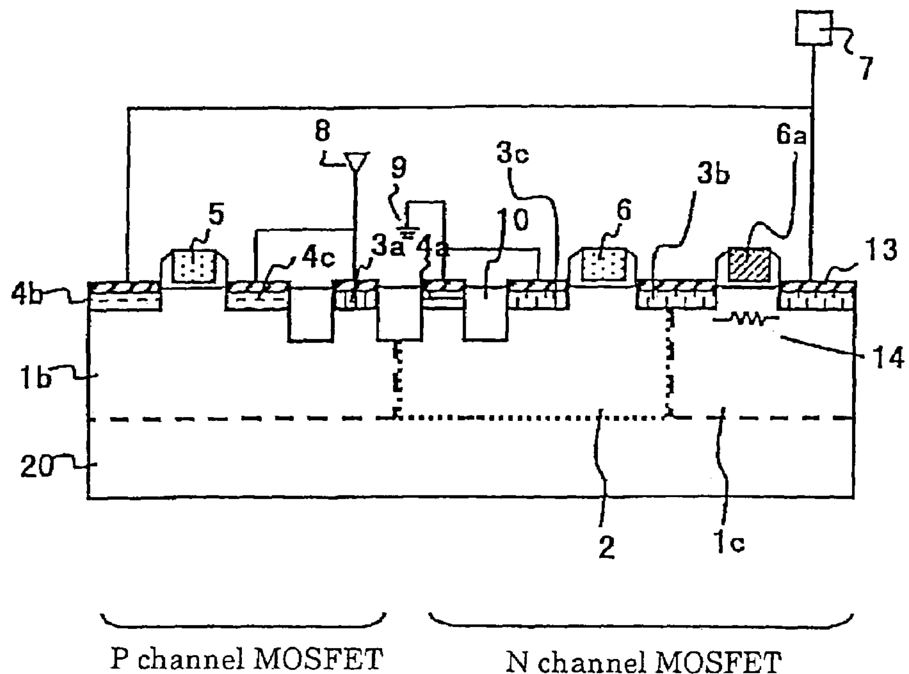
FIG. 11 is a schematic cross-sectional view showing the portion B–B' of FIG. 10.
Figure 12:
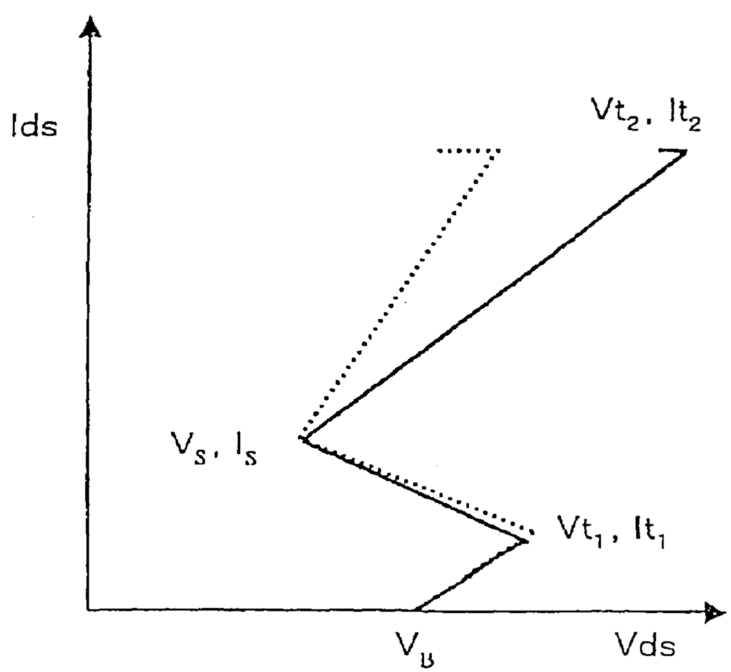
FIG. 12 is a diagram showing the I–V characteristic of a transistor in another conventional protection circuit section.
Figure 13:
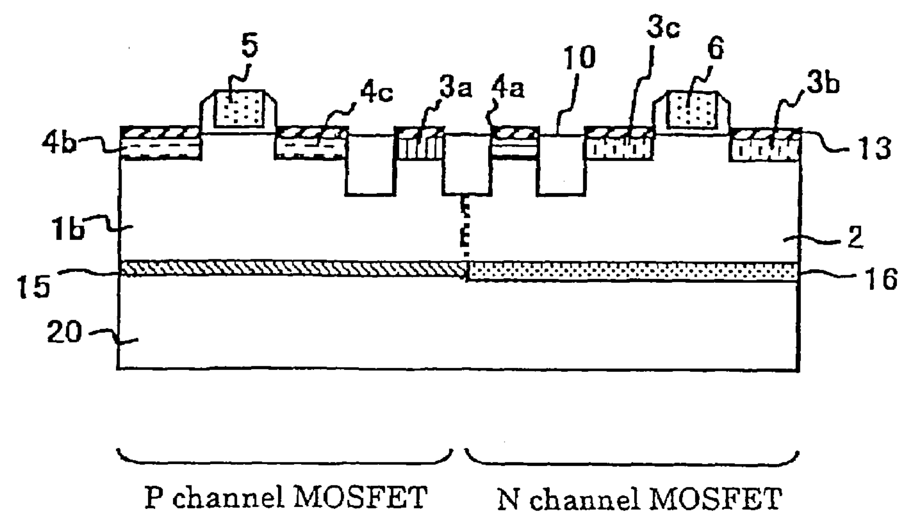
FIG. 13 is a view in explaining a prevention measure against latch-up in a CMOS.
Figure 14:
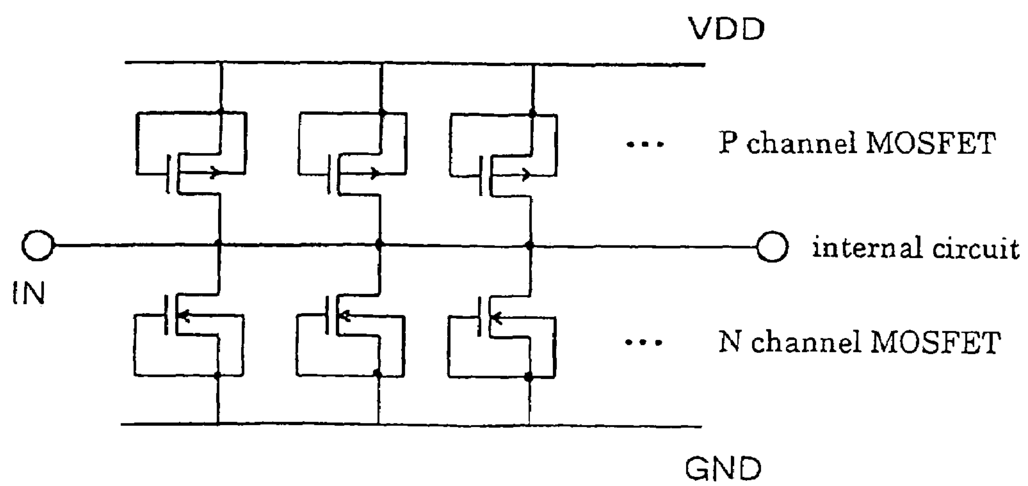
FIG. 14 is a diagram showing an input protection circuit.
Figure 15:
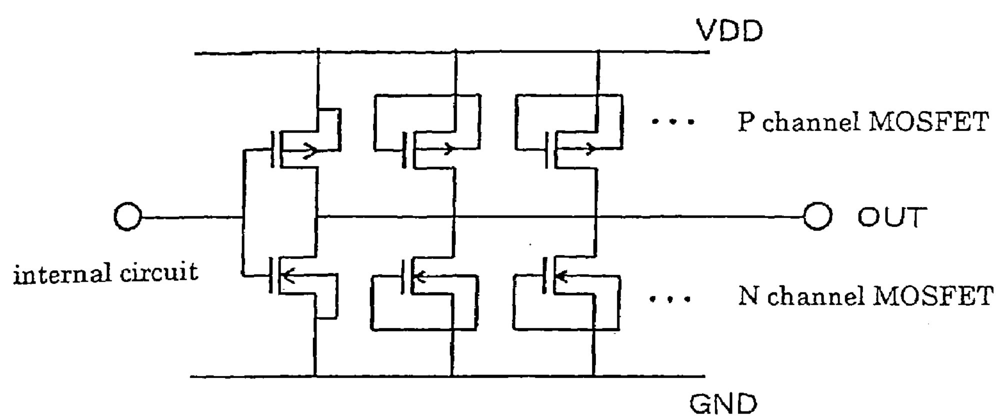
FIG. 15 is a diagram showing an output protection circuit.

In the present example, as a high-resistance region of the drain section is not set, the response of the protection circuit is made faster and high-speed operations can be realized. In addition, the drain current of the transistor is not lowered, and a sufficient driving current can be readily secured even in the output circuit. Further, since no additional resistance element is disposed between a gate and a contact, the spacing between gates can be narrowed and the width of the input/output protection circuit section or the distance between B–B' of FIG. 1 can be reduced a great deal. With the conventional technique shown in FIG. 11, if 8 lines of the gates are provided, the required width of the input/output protection circuit section is approximately 50 μm. As against this, in the present example, for the same number of gates, the width can be reduced down to approximately 25 μm.

Comparative Example 1

Figure 8:
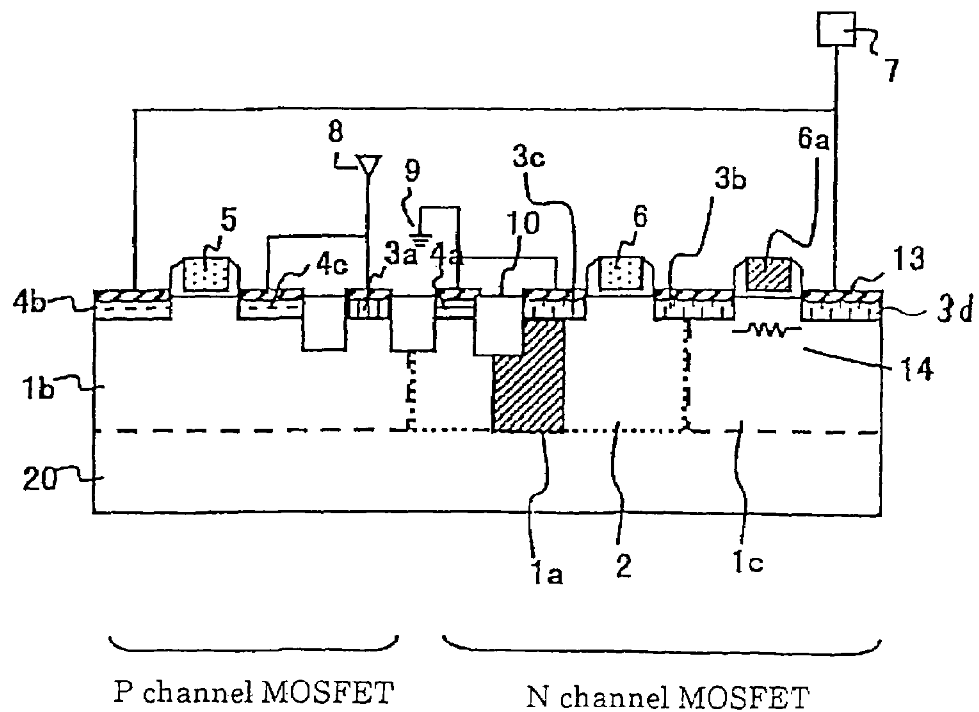
FIG. 8 is a schematic cross-sectional view showing a protection circuit section of a Comparative Example.
Figure 9:
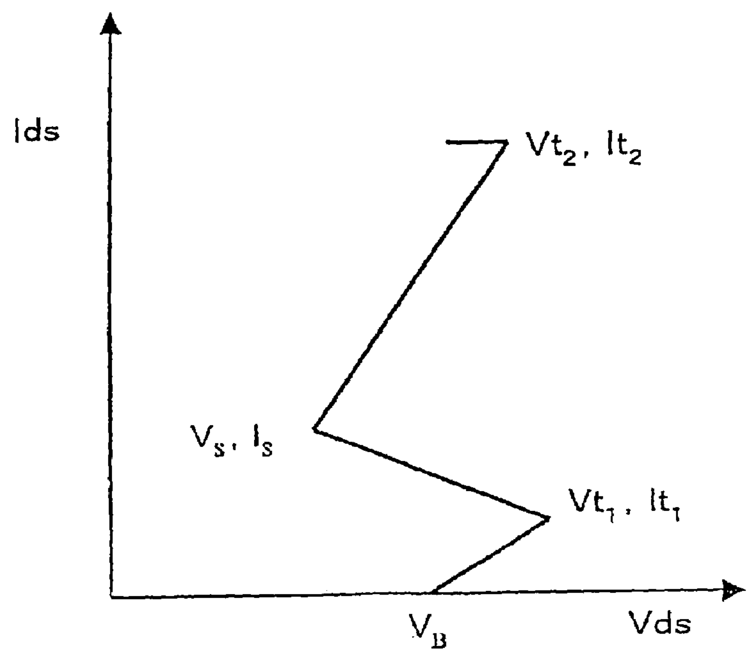
FIG. 9 is a diagram showing the I–V characteristic of a transistor in a conventional protection circuit section.
Figure 10:
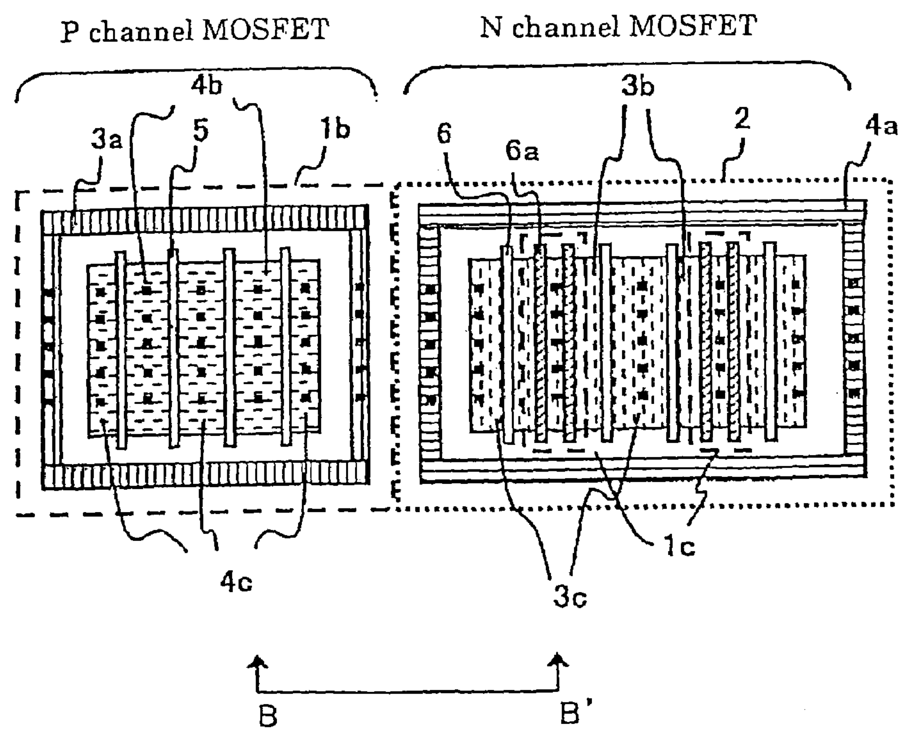
FIG. 10 is a schematic top plan view showing a protection circuit section of another conventional semiconductor device.

FIG. 8 shows a cross-sectional structure of a semiconductor device of the present Comparative Example. In this semiconductor device, under a control gate, an N-type well 1*c* is set and an internal terminal 7 is connected with an N-type diffusion region 3*d*. In this point, the present Comparative Example differs from the semiconductor device of Example 1, in which the input terminal 7 is connected with the drain region 3*b* and the input terminal 7 and the NMOSFET therein makes direct connection and not through a high-resistance region. Further, in this semiconductor device, no extension regions are provided to the source-drain regions, which is another point differing from Example 1. Except these differences, a semiconductor device was made in the same way as Example 1.

For the semiconductor device of the present Comparative Example, $V_{t1}$ and $V_{t2}$ are approximately 8V and 12V, respectively, and this value of $V_{t1}$ is higher than that of Example 1. It is considered that the inducing effect that N-type well 1*a* has on the operations of the parasitic bipolar transistor is weakened by the resistance component of the N-type well 1*c*. Further, the width of the input/output protection circuit section remains 110 approximately 50 μm for 8 lines of the gates and a reduction of the size of the protection circuit was by no means accomplished.

Example 2

Figure 3:
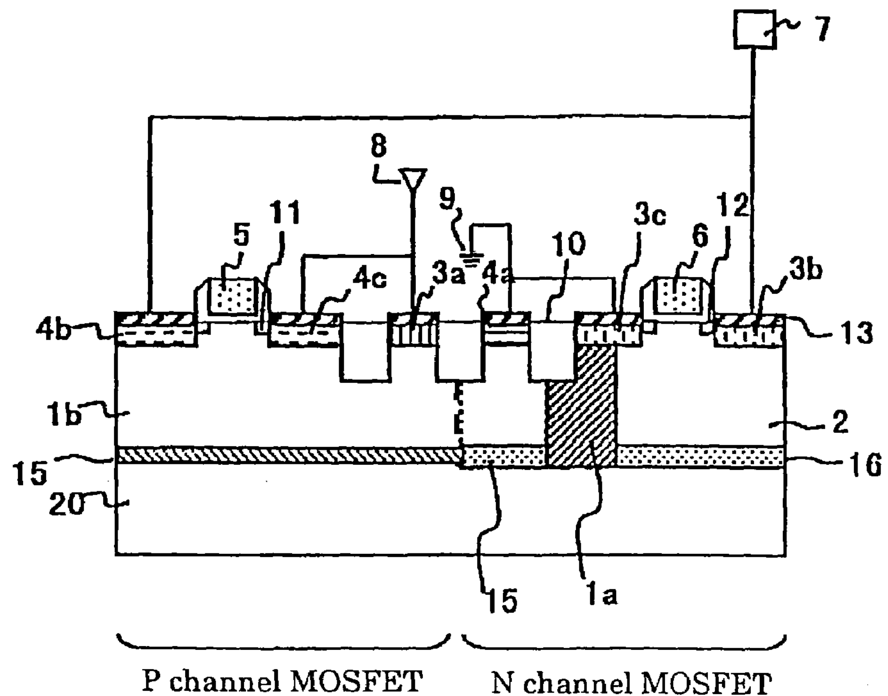
FIG. 3 is a schematic cross-sectional view showing a protection circuit section of another semiconductor device in accordance with the present invention.

FIG. 3 shows a cross-sectional structure of an input protection circuit section of the present example. This input protection circuit section is an example in which dopant high-concentration regions or so-called retrograde wells 15 and 16 are formed, at bottom sections of the N-type well 1*b* and the P-type well 2 in the CMOS of FIG. 2, respectively. The formation of the retrograde wells is performed by conducting ion implantation a plurality of times under different conditions of an injection energy and a dose but using the same mask. In the present example, a phosphorus concentration of $1\times10^{17}$ $cm^{-3}$ or so is employed for the N-type wells 1*b* and 1*a*, and a boron concentration of $1\times10^{17}$ $cm^{-3}$ or so, for the P-type well 2. Further, a phosphorus concentration for the dopant high-concentration region 15 is set to be $2\times10^{17}$ $cm^{-3}$ or so and a boron concentration for the dopant high-concentration region 16, $2\times10^{17}$ $cm^{-3}$ or so.

It is well known that setting a dopant high-concentration region can reduce the shunt resistance and improve the latch-up-proof but, in the conventional techniques, this also brings about a problem of lowering the ESD-proof. In contrast with this, because the N-type well 1*a* is set under the source region 3*c* in the present example, after the breakdown of the drain region 3*b* occurs in the N-channel MOSFET, a hole current starts flowing down along a current path through the silicon substrate 20 that has a high electric resistance. This facilitates the electric potential of the base region of the lateral parasitic bipolar transistor to increase and, at the same time, can reduce the trigger voltage $V_{t1}$ so that the ESD-proof is improved. Meanwhile, in the internal circuit region (not shown in the drawing), because the shunt resistance is made smaller by the dopant high-concentration regions 15 and 16, the proof is a good deal improved against latch-up that may occur between the input/output protection circuit section and the internal circuit region. In the semiconductor device of the present example, even an injection of a current of 500 mA or more into the input/output terminal did not bring about latch-up.

As described above, the semiconductor device of the present invention has, under a first diffusion layer that constitutes a transistor of a protection circuit section, a first conductive type well with a dopant concentration lower than that of the first diffusion layer so that it becomes easier to induce operations of a lateral parasitic bipolar transistor composed of source-drain regions and a channel layer of the afore-mentioned transistor. Consequently, a protection circuit having a high response speed and an excellent ESD-proof can be obtained. In addition, the semiconductor device of the present invention has a structure in which a second diffusion layer of the afore-mentioned transistor is connected with an input/output terminal section and, unlike the prior art, a high-resistance region is not set, the drain current of the transistor is not lowered, and a sufficient driving current can be readily secured even in the output circuit or the like. Further, the spacing of the gates in the protection circuit section can be narrowed and, thus, further miniaturization of the input/output protection circuit section can be made.

Further, in case that the input/output protection circuit section comprises a complementary field effect transistor, a surge can flow down through a plurality of lines efficiently, which provides another advantage of attaining further improvement of the ESD-proof. In this instance, by employing a structure in which a dopant high-concentration region is set beneath wells that constitutes the transistor, and the depth of the afore-mentioned first conductive type well is set deeper than the level at which the dopant high-concentration region is formed, a protection circuit section having a good ESD-proof, together with a good latch-up-proof, can be obtained.

This application is based on Japanese patent application NO.HEI11-209407, the content of which is incorporated hereinto by reference.

What is claimed is:

1. A semiconductor device having an input/output protection circuit section on a semiconductor substrate, the input/output protection circuit section comprising:

a plurality of field effect transistors connected in parallel, each of which has a source diffusion layer of a first conductive type and a drain diffusion layer of the first conductive type, a channel region therebetween and a gate electrode that is disposed between said source and drain diffusion layers;

a dopant diffusion region of a second conductive type that is set at a distance from said plurality of field effect transistors; and an element isolation film located in the substrate between the dopant diffusion region of the second conductive type and the source diffusion layer of the first conductive type, for separating the dopant diffusion region from the source diffusion layer, wherein said dopant diffusion region is connected to a reference potential, and wherein the source diffusion layer is also connected to said reference potential, wherein the drain diffusion layer is connected directly to an input/output terminal section without an intervening resistance element, wherein a first conductive type well having a lower dopant concentration than the dopant concentration of the source diffusion layer is formed directly under the source diffusion layer and thereby the first conductive type well is electrically connected directly with the source diffusion layer, wherein no first conductive type well is formed under or connected to the drain diffusion layer, wherein the first conductive type well at least partially underlies the element isolation film, and wherein a second conductive type well is formed on the surface of the semiconductor substrate, said source and drain diffusion layers of the first conductive type and said dopant diffusion region of the second conductive type are disposed over the second conductive type well, and thereby the dopant diffusion region of the second conductive type is electrically connected directly with the second conductive well, but the first conductive well is not physically contacted directly with the dopant diffusion region of the second conductive type.

2. The semiconductor device claimed in claim 1, wherein said plurality of field effect transistors are N-channel type field effect transistors, and wherein said source diffusion layer is also connected to the reference potential to which said dopant diffusion region is connected.

3. A semiconductor device having an input/output protection circuit section on a semiconductor substrate, the input/output protection circuit section comprising:

a complementary field effect transistor including a first field effect transistor having a source diffusion layer of a first conductive type, a drain diffusion layer of the first conductive type, a channel region therebetween and a gate electrode that is disposed between the source and drain diffusion layers of the first conductive type, and a second field effect transistor having a source diffusion layer of a second conductive type, a drain diffusion layer of the second conductive type, and a gate electrode that is disposed between the source and drain diffusion layers of the second conductive type, wherein a first dopant diffusion region of the second conductive type is set at a distance from said first field effect transistor, and a second dopant diffusion region of the first conductive type is set at a distance from said second field effect transistor, wherein at least an element isolation film is located in the substrate between the first dopant diffusion region of the second conductive type and the source diffusion layer of the first conductive type, for separating the first dopant diffusion regions from the source diffusion layer of said first field effect transistor, wherein the first dopant diffusion region is connected to a first reference potential, the source diffusion layer of the first field effect transistor is also connected to the first reference potential, the second dopant diffusion region is connected to a second reference potential, and the source diffusion layer of the second field effect transistor is also connected to the second reference potential, wherein the drain diffusion layer of the first field effect transistor and the drain diffusion layer of the second field effect transistor are each connected directly to an input/output terminal section without an intervening resistance element, wherein a first conductive type well having a lower dopant concentration than dopant concentration of the source diffusion layer of the first field effect transistor is formed directly under the source diffusion layer of the first field effect transistor and thereby the first conductive type well is electrically connected directly with the source diffusion layer of the first filed effect transistor, wherein no first conductive type well is formed under the drain diffusion layer of the first field effect transistor or is connected with the drain diffusion layer of the first field effect transistor, wherein the first conductive type well of the first field transistor at least partially underlies the element isolation film of the first field effect transistor, and wherein a second conductive type well is formed on the surface of the semiconductor substrate of the first field effect transistor, said source and drain diffusion layers of the first conductive type and said dopant diffusion region of the second conductive type are disposed over the second conductive type well, and thereby the dopant diffusion region of the second conductive type for the first field effect transistor is electrically connected directly with the second conductive type well but the first conductive well is not physically contacted directly with the dopant diffusion region of the second conductive type.

4. The semiconductor device claimed in claim 3, wherein the gate electrode, the source and drain diffusion layer of the first conductive type and the first dopant diffusion region of the second conductive type of the first field effect transistor are disposed over a second conductive type well that is formed on the surface of the semiconductor substrate, and wherein the bottom of said first conductive type well of the first field effect transistor is formed at the same depth as the bottom of the second conductive type well of the first field effect transistor or at a level deeper than the bottom of the second conductive type well.

5. The semiconductor device claimed in claim 4, wherein, beneath the second conductive type well of the first field effect transistor, there is set a dopant high-concentration region containing second conductive type dopants with a higher dopant concentration than the second conductive type well of the first field effect transistor, and wherein the bottom of said first conductive type well of the first field effect transistor is formed at the same depth as the bottom of said dopant high-concentration region or at a level deeper than the bottom of said dopant high-concentration region.

6. The semiconductor device claimed in claim 3, wherein the first field effect transistor is an N-channel type field effect transistor, and wherein the source diffusion layer of the first field effect transistor is also connected to the first reference potential, to which said first dopant diffusion region is connected.

7. A semiconductor device having an input/output protection circuit section on a semiconductor substrate, the input/output protection circuit section comprising:

a plurality of field effect transistors connected in parallel, each of which has a source diffusion layer of a first conductive type and a drain diffusion layer of the first conductive type, a channel region therebetween and a gate electrode that is disposed between said source and drain diffusion layers;

a dopant diffusion region of a second conductive type that is set at a distance from said plurality of field effect transistors; and an element isolation film located in the substrate between the dopant diffusion regions of the second conductive type and the source diffusion layer of the first conductive type, for separating the dopant diffusion regions from the source diffusion layer, wherein said dopant diffusion region and said source diffusion layer of the first conductive type are connected to a reference potential, wherein the drain diffusion layer is connected directly to an input/output terminal section without an intervening resistance element, wherein a first conductive type well with a lower dopant concentration than the dopant concentration of the source diffusion layer is formed directly under the source diffusion layer and thereby the first conductive type well is electrically connected directly with the source diffusion layer of the first conductive type, wherein no first conductive well is formed under or connected to the drain diffusion layer of the first conductive type, wherein the first conductive type well at least partially underlies an element isolation film, and wherein a second conductive type well is formed on the surface of the semiconductor substrate, the source and drain diffusion layers of the first conductive type and the dopant diffusion region of the second conductive type are disposed over the second conductive well, and thereby the dopant diffusion region of the second conductive type is electrically connected directly with the second conductive well, but the first conductive well is not physically contacted directly with the dopant diffusion region of the second conductive type.

8. A semiconductor device claimed in claim 1, wherein the source diffusion layer is connected to a ground terminal.

9. A semiconductor device having an input/output protection circuit section on a semiconductor substrate, the input/output protection circuit section comprising:

a plurality of field effect transistors connected in parallel, each of which has a source diffusion layer of a first conductive type and a drain diffusion layer of the first conductive type, a channel region therebetween and a gate electrode that is disposed between said source and drain diffusion layers;

a dopant diffusion region of a second conductive type that is set at a distance from said plurality of field effect transistors; and an element isolation film located in the substrate between the dopant diffusion region of the second conductive type and the source diffusion layer of the first conductive type, for separating the dopant diffusion region from the source diffusion layer, wherein said dopant diffusion region is connected to a reference potential, and the source diffusion layer is also connected to the reference potential, wherein the drain diffusion layer is connected directly to an input/output terminal section without an intervening resistance element, wherein a first conductive type well with lower dopant concentration than the dopant concentration of the source diffusion layer is formed directly under the source diffusion layer and thereby the first conductive type well is electrically connected directly with the source diffusion layer, wherein no first conductive type well is formed under the drain diffusion layer or is connected with the drain diffusion layer, wherein the first conductive type well at least partially underlies the element isolation film, and wherein a second conductive type well is formed on the surface of the semiconductor substrate, said source and drain diffusion layers of the first conductive type and said dopant diffusion region of the second conductive type are disposed over the second conductive well, and thereby the dopant diffusion region of the second conductive type is electrically connected directly to the second conductive type well, but the first conductive well is not physically contacted directly with the dopant diffusion region of the second conductive type, wherein the bottom of said first conductive type well is formed at the same depth as the bottom of the second conductive type well or at a level deeper than the bottom of the second conductive type well; and wherein said source and drain diffusion layers are both made to have an extension region that is set at end sections of the source diffusion layer and the drain diffusion layer on the side of the channel region, and the dopant concentration of the extension region is lower than the dopant concentration of said source and drain diffusion layers, but higher than the dopant concentration of the first conductive well.

10. The semiconductor device claimed in claim 1, wherein each of said field effect transistors has a gate length or a length of the gate electrode not greater than 0.2 μm.

11. The semiconductor device claimed in claim 1, wherein each of said field effect transistors has a gate length or a length of the gate electrode not greater than 0.2 μm; or the source diffusion layer and the drain diffusion layer are both made to have an extension region that is set at end sections of the source diffusion layer and the drain diffusion layer on the side of the channel region, and wherein the dopant concentration of the extension region is lower than the dopant concentration of said source and drain diffusion layers but higher than the dopant concentration of the first conductive type well.

12. The semiconductor device claimed in claim 3, wherein each of said field effect transistors has a gate length or a length of the gate electrode not greater than 0.2 μm.

13. The semiconductor device claimed in claim 3, wherein said first field effect transistor has an addition arrangement that the source region and the drain diffusion layer of the first field effect transistor are both made to have an extension region that is set at end sections of said source diffusion layer and said drain diffusion layer on the side of the channel region of the first field effect transistor, and wherein the dopant concentration of the extension region is lower than the dopant concentration of said source and drain diffusion layers but higher than the dopant concentration of the first conductive type well.

14. The semiconductor device claimed in claim 7, wherein each of said field effect transistors has a gate length or a length of the gate electrode not greater than 0.2 μm.

15. The semiconductor device claimed in claim 7, wherein each of said field effect transistors has an addition arrangement that the source region and the drain diffusion layer are both made to have an extension region that is set at end sections of said source diffusion layer and said drain diffusion layer on the side of the channel region, and wherein the dopant concentration of the extension region is lower than the dopant concentration of said source and drain diffusion layers but higher than the dopant concentration of the first conductive type well.

* * * * *